United States Patent
Afsahi et al.

(10) Patent No.: US 7,729,671 B2
(45) Date of Patent: Jun. 1, 2010

(54) METHOD AND SYSTEM FOR ENHANCING EFFICIENCY BY MODULATING POWER AMPLIFIER GAIN

(75) Inventors: Ali Afsahi, San Diego, CA (US);
Vikram Magoon, San Diego, CA (US);
Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 508 days.

(21) Appl. No.: 11/618,871

(22) Filed: Dec. 31, 2006

(65) Prior Publication Data
US 2008/0137773 A1 Jun. 12, 2008

Related U.S. Application Data

(60) Provisional application No. 60/868,818, filed on Dec. 6, 2006.

(51) Int. Cl.
*H01Q 11/12* (2006.01)
*H04B 1/04* (2006.01)
(52) U.S. Cl. .................. 455/127.1; 455/127.2
(58) Field of Classification Search .... 455/127.1–127.3
See application file for complete search history.

(56) References Cited

U.S. PATENT DOCUMENTS

| | | | |
|---|---|---|---|
| 5,369,789 A * | 11/1994 | Kosugi et al. | 455/126 |
| 6,763,228 B2 * | 7/2004 | Prentice et al. | 455/127.2 |
| 7,082,290 B2 * | 7/2006 | Takano et al. | 455/102 |
| 7,519,337 B2 * | 4/2009 | Ito et al. | 455/127.3 |
| 2001/0027090 A1 * | 10/2001 | Uesugi | 455/126 |
| 2005/0233714 A1 * | 10/2005 | Kajiwara et al. | 455/127.3 |
| 2006/0111060 A1 * | 5/2006 | Kuriyama et al. | 455/127.2 |
| 2006/0234656 A1 * | 10/2006 | Matsui et al. | 455/127.3 |
| 2006/0234661 A1 * | 10/2006 | Toyota et al. | 455/252.1 |
| 2006/0239380 A1 * | 10/2006 | Khlat et al. | 375/297 |
| 2006/0258306 A1 * | 11/2006 | Balteanu et al. | 455/108 |
| 2007/0014381 A1 * | 1/2007 | Rozenblit et al. | 375/297 |
| 2007/0287393 A1 * | 12/2007 | Nandipaku et al. | 455/127.1 |

* cited by examiner

*Primary Examiner*—Simon D Nguyen
(74) *Attorney, Agent, or Firm*—McAndrews, Held & Malloy

(57) ABSTRACT

Aspects of a method and system for enhancing efficiency by modulating power amplifier (PA) gain are presented. Aspects of the system may comprise a PA gain modulator that enables modification of an amplitude of a digital baseband signal. A baseband processor may enable computation of a first gain value based on the modification. The baseband processor may enable computation of a second gain value based on the first gain value. A PA may enable generation of an RF output signal based on the modified digital baseband signal and the second gain value.

26 Claims, 4 Drawing Sheets

METHOD AND SYSTEM FOR ENHANCING EFFICIENCY BY MODULATING POWER AMPLIFIER GAIN

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

This application also makes reference to:

U.S. application Ser. No. 11/618,876 filed on Dec. 31, 2006; and

U.S. application Ser. No. 11/618,864 filed on Dec. 31, 2006.

Each of the above stated applications is hereby incorporated herein by reference in its entirety.

FIELD OF THE INVENTION

Certain embodiments of the invention relate to wireless communications. More specifically, certain embodiments of the invention relate to a method and system for enhancing efficiency by modulating power amplifier gain.

BACKGROUND OF THE INVENTION

A power amplifier (PA) circuit may be characterized by its mode, or "class" of operation. Exemplary classes include Class A, Class AB, and Class B. In Class A operation, a PA may operate in a conducting, or ON, state during 100% of the cycle, or the entire cycle, of the input signal. In Class A operation, the output signal from the PA is typically a scaled version of the input signal, where the scaling factor is a function of the gain associated with the PA circuit. However, for Class A operation, the PA is typically in a conducting state even when there is no input signal. Furthermore, even when the PA is amplifying an input signal, the efficiency of the PA may not exceed 50%.

In Class B operation, a PA may operate in a conducting state during 50%, or half, of the cycle of the input signal. This may result in large amounts of distortion of the input signal in the output signal. The higher efficiency of the Class B PA results from the PA being in a non-conducting, or OFF, state half of the time.

In Class AB operation, a PA may operate in a conducting state for greater than 50%, but less than 100%, of the cycle of the input signal. In Class AB operation, the PA may be more efficient than in Class A operation, but less efficient than in Class B operation. Furthermore, in Class AB operation, the PA may produce more distortion than in Class A operation, but less than in Class B operation.

When the peak input signal level to a PA circuit is large compared to the average input signal level, or high peak to average ratio, the PA circuit may be biased to accommodate the peak input signal level, $P_{INMAX}$. The value of $P_{DC}$ may be set to enable generation of an RF signal output level from the PA circuit, $P_{RFMAX}$, when the corresponding input signal level is $P_{INMAX}$. Thus, efficiency of the PA circuit may be highest for a given value $P_{DC}$ when the RF signal output level from the PA circuit is $P_{RFMAX}$. However, for high peak to average ratios, the input signal level is typically less than $P_{INMAX}$ for a substantial portion of the time that the PA circuit is operating. Therefore, the average RF signal output level, $P_{RFAVG}$, may be significantly lower than $P_{RFMAX}$. Consequently, the need to support high peak to average ratios may result in low efficiency for the PA circuit.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for enhancing efficiency by modulating power amplifier gain, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for enhancing efficiency by modulating power amplifier gain. Various embodiments of the invention may enable the amplitude of input signals to a PA circuit to be controlled within an amplitude range, which enables the PA to operate in an efficient manner. Efficiency, η, for a PA circuit may be defined as in the following equation:

$$\eta = \frac{P_{RF}}{P_{DC}} \qquad [1]$$

where $P_{RF}$ refers to the power level for an RF signal output by a PA circuit in an RF transmitter, and $P_{DC}$ refers to delivered power from a DC power supply source (such as a battery).

In various embodiments of the invention, a baseband processor may dynamically adjust the gain level of a PA modulator. The PA modulator digitally applies the dynamically adjustable gain level to a digital baseband signal to maintain a constant input signal level at a PA circuit. The input signal level may be selected to enable efficient operation of the PA. The baseband processor may also send control signals to the PA circuit to dynamically control the gain of the PA to enable generation of an output RF signal that is based on a scaled and RF upconverted analog version of the baseband signal. In this invention the input of the PA may be kept large most of the time to have higher efficiency.

The efficiency of a PA circuit may increase with increasing input signal amplitudes. Various embodiments of the invention may enable generation of input RF signals that enable efficient PA operation.

Figure 1:
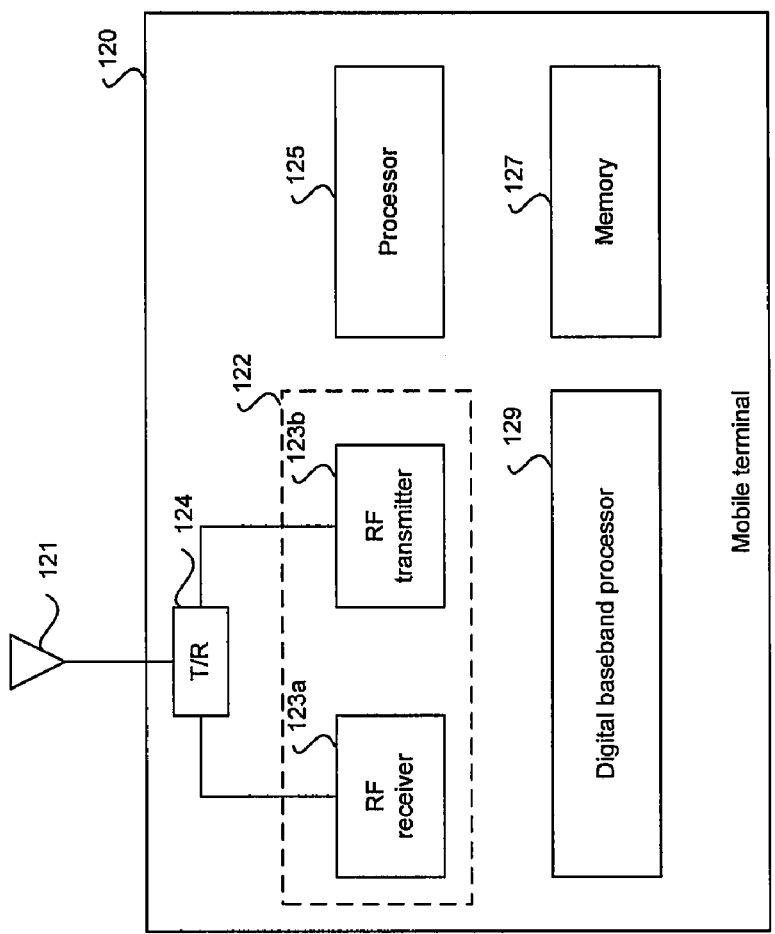
FIG. 1 is a block diagram illustrating and exemplary mobile terminal, which may be utilized in connection with an embodiment of the invention.

FIG. 1 is a block diagram illustrating and exemplary mobile terminal, which may be utilized in connection with an embodiment of the invention. Referring to FIG. 1, there is shown mobile terminal 120 that may comprise an RF receiver 123a, an RF transmitter 123b, a digital baseband processor 129, a processor 125, and a memory 127. In some embodiments of the invention, the RF receiver 123a, and RF transmitter 123b may be integrated into an RF transceiver 122, for example. A single transmit and receive antenna 121 may be communicatively coupled to the RF receiver 123a and the RF transmitter 123b. A switch 124, or other device having switching capabilities may be coupled between the RF receiver 123a and RF transmitter 123b, and may be utilized to switch the antenna 121 between transmit and receive functions.

The RF receiver 123a may comprise suitable logic, circuitry, and/or code that may enable processing of received RF signals. The RF receiver 123a may enable receiving RF signals in frequency bands utilized by various wireless communication systems, such as GSM and/or CDMA, for example.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b for transmission via a wireless communication medium. The digital baseband processor 129 may also provide control and/or feedback information to the RF receiver 123a and to the RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission via the wireless communication medium.

The RF transmitter 123b may comprise suitable logic, circuitry, and/or code that may enable processing of RF signals for transmission. The RF transmitter 123b may enable transmission of RF signals in frequency bands utilized by various wireless communications systems, such as GSM and/or CDMA, for example.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, which may be utilized to control the operation of at least one block in the mobile terminal 120. For example, the memory 127 may comprise information necessary to configure the RF receiver 123a to enable receiving RF signals in the appropriate frequency band.

Figure 2:
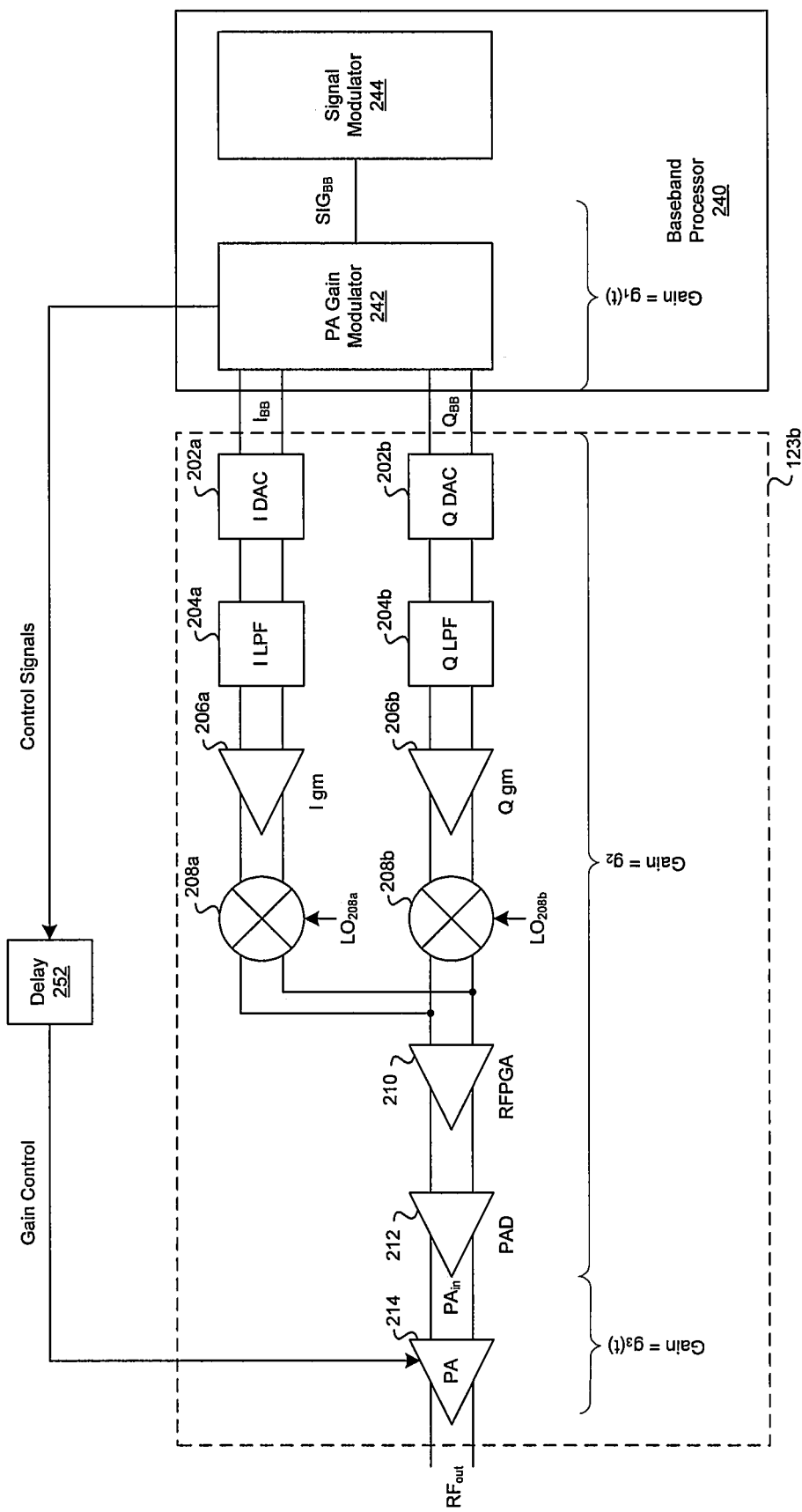
FIG. 2 is an exemplary block diagram illustrating an RF transmitter utilizing power amplifier gain modulation, in accordance with an embodiment of the invention.

FIG. 2 is an exemplary block diagram illustrating an RF transmitter utilizing power amplifier gain modulation, in accordance with an embodiment of the invention. Referring to FIG. 2, there is shown an RF transmitter 123b, a delay block 252, and a baseband processor 240. The RF transmitter 123b may comprise a power amplifier (PA) 214, a power amplifier driver (PAD) 212, an RF programmable gain amplifier (RFPGA) 210, a transmitter In-phase signal (I) mixer 208a, a transmitter Quadrature-phase signal (Q) mixer 208b, an I transconductance amplifier (gm) 206a, a Q gm 206b, an I low pass filter (LPF) 204a, a Q LPF 204b, an I digital to analog converter (I DAC) 202a, and a Q DAC 202b. The baseband processor 240 may comprise a PA gain modulator 242, and a signal modulator 244.

The PA 214 may comprise suitable logic, circuitry, and/or code that may enable amplification of input signals to generate a transmitted signal of sufficient signal power (as measured by dBm, for example) for transmission via a wireless communication medium. In an exemplary embodiment of the invention, the PA 214 may receive a differential input signal, labeled $PA_{in}$ in FIG. 2, and output a differential output signal, labeled $RF_{out}$ in FIG. 2. In addition, the PA 214 may receive a control signal, labeled Gain Control in FIG. 2, which may enable the PA 214 to dynamically select a gain level, referred to as $g_3(t)$. The gain level may vary with time in response to the Gain Control signal. The gain level may determine an amplification level by which the input signal $PA_{in}$ may be amplified to generate the output signal $RF_{out}$.

The PAD 212 may comprise suitable logic, circuitry, and/or code that may enable amplification of input signals to generate an amplified output signal. The PAD 212 may be utilized in multistage amplifier systems wherein the output of the PAD 212 may be an input to a subsequent amplification stage. In an exemplary embodiment of the invention, the PAD 212 may receive a differential input signal and output a differential output signal, labeled $PA_{in}$ in FIG. 2.

The RFPGA 210 may comprise suitable logic, circuitry, and/or code that may enable amplification of input signals to generate an amplified output signal, wherein the amount of amplification, as measured in dB for example, may be determined based on an input control signal. In various embodiments of the invention, the input control signal may comprise binary bits. In an exemplary embodiment of the invention, the RFPGA 210 may receive a differential input signal and generate a differential output signal.

The transmitter I mixer 208a may comprise suitable logic, circuitry, and/or code that may enable generation of an RF signal by upconversion of an input signal. The transmitter I mixer 208a may utilize an input local oscillator signal labeled as $LO_{208a}$ to upconvert the input signal. The upconverted signal may be an RF signal. The transmitter I mixer 208a may produce an RF signal for which the carrier frequency may be equal to the frequency of the signal $LO_{208a}$. In an exemplary embodiment of the invention, the transmitter I mixer 208a may receive a differential input signal and generate a differential output signal.

The transmitter Q mixer 208b may be substantially similar to the transmitter I mixer 208a. The transmitter Q mixer 208b may utilize an input local oscillator signal labeled as $LO_{208b}$ in quadrature (in FIG. 2) to upconvert the input signal.

The I gm 206a may comprise suitable, logic, circuitry, and/or code that may enable generation of an output current, the amplitude of which may be proportional to an amplitude of an input voltage, wherein the measure of proportionality may be determined based on the transconductance parameter, $gm_I$, associated with the I gm 206a. In an exemplary embodiment of the invention, the I gm 206a may receive a differential input signal and output a differential output signal.

The Q gm 206b may be substantially similar to the I gm 206a. The transconductance parameter associated with the Q gm 206b is $gm_Q$.

The I LPF 204a may comprise suitable logic, circuitry, and/or code that may enable selection of a cutoff frequency, wherein the LPF may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the I LPF 210a may be implemented as a passive filter, such as one that utilizes resistor, capacitor, and/or inductor elements, or implemented as an active filter, such as one that utilizes an operational amplifier. In an exemplary embodiment of the invention, the I LPF 210a may receive a differential input signal and output a differential output signal.

The Q LPF 204b may be substantially similar to the I LPF 204a.

The I DAC 202a may comprise suitable logic, circuitry, and/or code that may enable conversion of an input digital signal to a corresponding analog representation.

The Q DAC 202b may be substantially similar to the I DAC 202a.

The baseband processor 240 may comprise suitable logic, circuitry, and/or code that may enable processing tasks, which correspond to one or more layers in an applicable protocol reference model (PRM). For example, the baseband processor 240 may perform physical (PHY) layer processing, layer 1 (L1) processing, medium access control (MAC) layer processing, logical link control (LLC) layer processing, layer 2 (L2) processing, and/or higher layer protocol processing. The processing tasks performed by the baseband processor 240 may be referred to as being within the digital domain. The baseband processor 240 may also generate control signals. In an exemplary embodiment of the invention, the baseband processor 240 may generate differential output signals. The differential output signals may be referred to as quadrature baseband signals labeled $I_{BB}$ and $Q_{BB}$ in FIG. 2.

The signal modulator 244 may comprise suitable logic, circuitry and/or code that may enable generation of modulated baseband signals, labeled $SIG_{BB}$ in FIG. 2. The modulated baseband signals may be digital signals generated based on binary data. The amplitude of the signals $SIG_{BB}$ may vary with time. In an exemplary embodiment of the invention, the amplitude of the signals $SIG_{BB}$ may vary over a range from −50 dBm to 10 dBm.

The PA gain modulator 242 may comprise suitable logic, circuitry and/or code that may enable generation of quadrature baseband signals, labeled $I_{BB}$ and $Q_{BB}$ in FIG. 2, from a received modulated baseband signal, labeled $SIG_{BB}$ in FIG. 2. The PA gain modulator 242 may utilize the received modulated baseband signal, for which the amplitude may vary with time, to generate an intermediate signal, $INT_{BB}$, for which the amplitude is constant with time. The PA gain modulator 242 may utilize the intermediate signal to generate the quadrature baseband signals $I_{BB}$ and $Q_{BB}$.

The PA gain modulator 242 may determine a dynamic gain level, $g_1(t)$, when generating the signal $INT_{BB}$ from the signal $SIG_{BB}$ such that:

$$\|INT_{BB}(t)\|=g_1(t) \cdot \|SIG_{BB}(t)\| \quad [2]$$

and:

$$\|INT_{BB}(t)\|=\text{Constant} \quad [3]$$

where t represents time, $\|INT_{BB}(t)\|$ represents the non-time varying amplitude of the intermediate signal, $\|SIG_{BB}(t)\|$ represents the time varying amplitude of the modulated baseband signal, and Constant represents a numerical constant. Based on the dynamic gain level, $g_1(t)$, the PA gain modulator 242 may generate control signals, labeled Control Signals in FIG. 2.

In various embodiments of the invention, the dynamic gain level, $g_1(t)$, may be utilized to compute the intermediate signal by digital processing. For example the digital $SIG_{BB}$ signal may be utilized as an input to a lookup table (LUT) which may generate a digital $INT_{BB}$ signal for a given gain level $g_1(t)$.

The delay block 252 may comprise suitable logic, circuitry and/or code that may enable reception of an input signal, labeled Control Signals in FIG. 2, and generation of output signals, labeled Gain Control in FIG. 2. The delay block 252 may receive the Control Signals at a time instant $t_0$, and then output the Control Signals at a later time instant $t_1$ as Gain Control signals.

In operation, the baseband processor 240 may generate data comprising a sequence of bits to be transmitted via a wireless communication medium. The signal modulator 244 may utilize the generated sequence of bits to generate a baseband signal $SIG_{BB}$. The amplitude of the baseband signal, $\|SIG_{BB}(t)\|$, may vary with time. The PA gain modulator 242 may receive the baseband signal $SIG_{BB}$ and generate an intermediate signal, $INT_{BB}$. The amplitude of the intermediate signal $\|INT_{BB}(t)\|$ may be constant. The baseband processor 240 may configure the PA gain modulator 242 to select a value for the constant amplitude level, Constant, as set forth in equation [3]. A dynamic gain level $g_1(t)$ may be computed as set forth in equation [2]. Based on the computed dynamic gain level $g_1(t)$, the PA gain modulator 242 may generate control signals, labeled Control Signals in FIG. 2, which may be sent to the delay block 252.

Based on the intermediate signal, the baseband processor 240 may generate quadrature baseband signals labeled $I_{BB}$ and $Q_{BB}$ in FIG. 2. The baseband processor 240 may send the $I_{BB}$ signal to the I DAC 202a, and send the $Q_{BB}$ signal to the Q DAC 202b. The I DAC 202a may generate an analog signal. The Q DAC 202b may similarly generate an analog signal.

The analog signals generated by the I DAC 202a and Q DAC 202b may comprise undesirable frequency components. The I LPF 204a and Q LPF 204b may attenuate signal amplitudes associated with these undesirable frequency components in signals generated by the I DAC 202a and Q DAC 202b respectively. The baseband processor 240 may configure the transmitter I mixer 208a to select a frequency for the $LO_{208a}$ signal utilized to upconvert the filtered signal from the I LPF 204a. The upconverted signal output from the transmitter I mixer 208a may comprise an I component RF signal. The baseband processor 240 may similarly configure the transmitter Q mixer 208b to generate a Q component RF signal from the filtered signal from the Q LPF 204b.

The RFPGA 210 may amplify the I component and Q component RF signals to generate an RF signal, wherein the level of amplification that may be provided by the RFPGA 210 may be configured based on control signals generated by the baseband processor 240. The PAD 212 may provide a second stage of amplification for the signal generated by the RFPGA 210. The PAD 212 may generate an input RF signal to the PA 214, labeled $PA_{in}$ in FIG. 2. The level of signal gain in the RF transmitter 123b from the signal $INT_{BB}$ to the signal $PA_{in}$ may be referred to as $g_2$. In various embodiments of the invention, $g_2$ may be as in the following equation:

$$g_2 = c_1 \qquad [4]$$

where $c_1$ is a numerical constant.

The delay block 252 may utilize the previously received Control Signals from the PA gain modulator 242 to generate a Gain Control signal. The delay block 252 may delay generation of the Gain Control signal from the received Control Signal by a suitable amount of time so as to apply the Gain Control signal to a $PA_{in}$ signal that was generated in response to the previous $I_{BB}$ and $Q_{BB}$ signals. The PA 214 may receive the Gain Control signal and dynamically select an amplification level, $g_3(t)$, which may be utilized to generate an output RF signal, $RF_{out}$, such that:

$$\|RF_{out}(t)\| = g_3(t) \cdot \|PA_{in}(t)\| \qquad [5]$$

where $\|RF_{out}(t)\|$ refers to the amplitude of the PA 214 output signal, and $\|PA_{in}(t)\|$ refers to the amplitude of the PA 214 input signal. In various embodiments of the invention, the amplitude $\|PA_{in}(t)\|$ may be constant with time. The PA output signal may be related to the baseband input signal as shown in the following equation:

$$\|RF_{out}(t)\| = G \cdot \|SIG_{BB}(t)\| \qquad [6]$$

where G represents an overall gain level through the baseband processor 240 and RF transmitter 123b. The value for G may be as shown in the following equation:

$$G = g_1(t) \cdot g_2 \cdot g_3(t) \qquad [7]$$

where $g_1(t)$ is as described in equation [2], $g_2$ is as described in equation [4], and $g_3(t)$ is as described in equation [5]. In various embodiments of the invention, G may be as shown in the following equation:

$$G = c_2 \qquad [8]$$

where $c_2$ is a numerical constant.

The amplified signal from the PA 214, $RF_{out}$, may be transmitted to the wireless communications medium via the antenna 121.

In various embodiments of the invention, the PA gain modulator 242 may compute a value $g_1(t)$ in accordance with equation [2] at a given time instant. Based on the computed value $g_1(t)$, a value $g_3(t)$ may be computed in accordance with equations [4], [7], and [8]. The PA gain modulator 242 may generate Control Signals based on the computed value $g_3(t)$. The delay block 252 may generate corresponding Gain Control signals that enable the PA 214 to be configured to provide a $g_3(t)$ level of signal amplification.

In an exemplary embodiment of the invention, an increase in the amplitude $\|SIG_{BB}(t)\|$ may result in a decrease in the gain level $g_1(t)$ and a corresponding increase in the gain level $g_3(t)$ in accordance with equations [4], [7] and [8]. The decrease in the gain level $g_1(t)$ may, for example, enable the amplitude $\|PA_{in}(t)\|$ to remain constant even when there is an increase in the amplitude $\|SIG_{BB}(t)\|$. The increase in the gain level $g_3(t)$ may enable the overall gain level between the signal $SIG_{BB}$ and the signal $RF_{out}$ to remain constant at a level $c_2$ (as set forth in equation [8] above) even when the respective intermediate gain levels $g_1(t)$ and $g_3(t)$ are dynamically adjusted. For example, when $\|SIG_{BB}(t)\|$ decreases, the gain $g_1(t)$ increases, and the gain $g_3(t)$ decreases such that $\|PA_{in}(t)\|$ remains constant. In various embodiments of the invention, the increase in $g_1(t)$ and decrease in $g_3(t)$ are in accordance with equations [4], [7] and [8]. The value of $\|PA_{in}(t)\|$ may be selected to enable the PA 214 to operate with high efficiency. Thus, in various embodiments of the invention, the peak to average ratio at the PA may be reduced in comparison to systems, which do not dynamically adjust PA gain levels.

Figure 3:
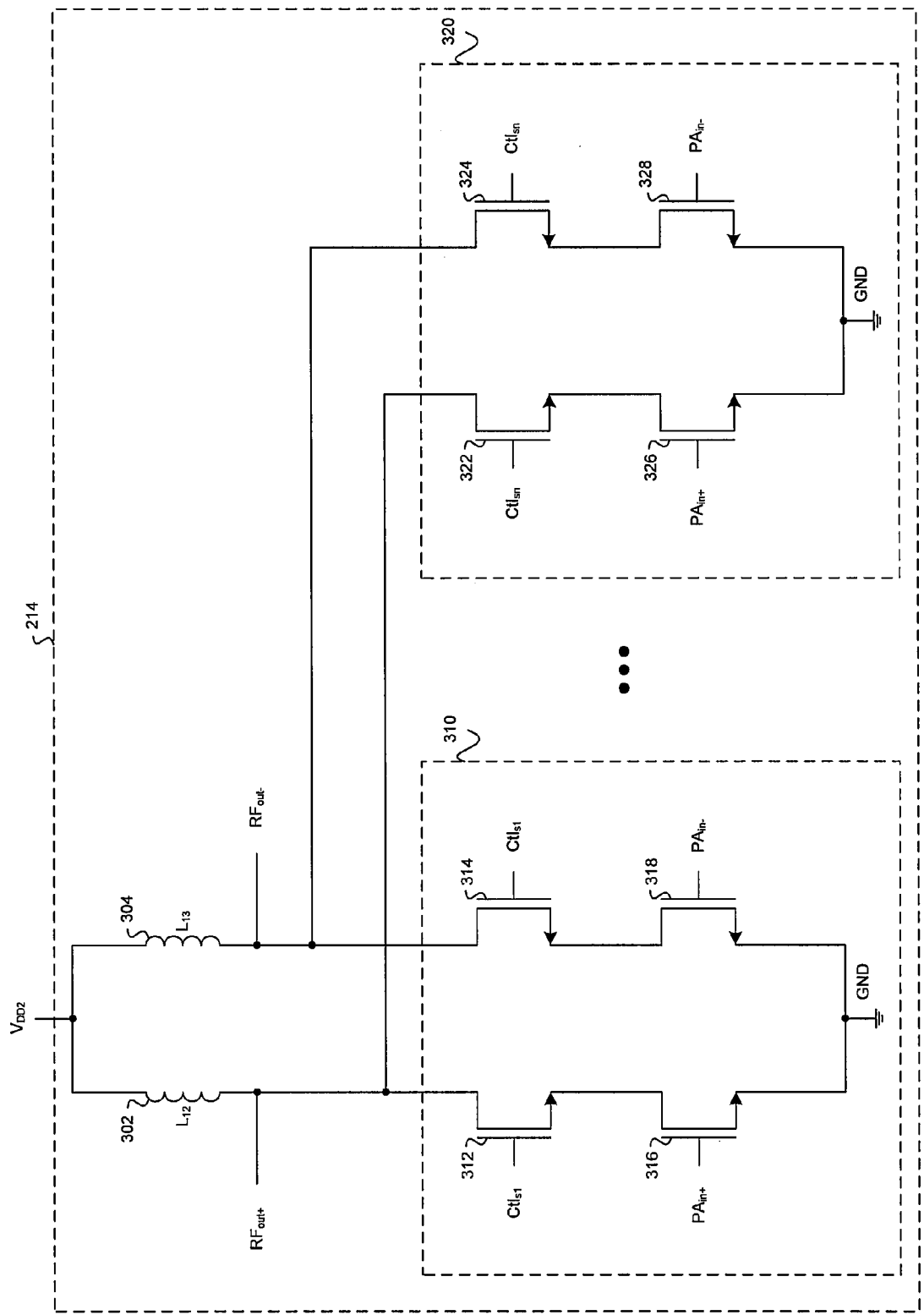
FIG. 3 is a diagram of an exemplary power amplifier with programmable gain, in accordance with an embodiment of the invention.

FIG. 3 is a diagram of an exemplary power amplifier with programmable gain, in accordance with an embodiment of the invention. Referring to FIG. 3, there is shown a PA 214. The PA 214 may comprise a plurality of inductors 302 and 304, and a plurality of gain stages 310, ..., and 320. The gain stage 310 may comprise a plurality of transistors 312, 314, 316 and 318. The gain stage 320 may comprise a plurality of transistors 322, 324, 326 and 328.

The plurality of gain stages 310, ..., and 320 may comprise individually selectable gain stages that may be enabled to dynamically increase gain, $g_3(t)$ for the PA 214, or disabled to dynamically decrease PA 214 gain $g_3(t)$. Individual gain stages may be selected based on the signal labeled Gain Control in FIG. 2. The gain stage 310 may represent a first gain stage in the plurality of gain stages, and the gain stage 320 may represent a last gain stage in a plurality of n gain stages.

The gain stage 310 may receive a control signals, labeled $Ctl_{s1\_}$ in FIG. 3, which enables or disables the gain stage 310. When enabled, the gain stage 310 may provide a $g_{s1}$ level of amplification of the differential input signal to transistors 316 and 318, labeled as $PA_{in+}$ and $PA_{in-}$ respectively in FIG. 3. The first stage gain level, $g_{s1}$, may contribute to the overall level of gain in the PA 214, $g_3(t)$.

The gain stage 320 may receive a control signal, labeled $Ctl_{sn}$ in FIG. 3, which enables or disables the gain stage 320. When enabled, the gain stage 320 may provide a $g_{sn}$ level of amplification of the differential input signal to transistors 326 and 328, labeled as $PA_{in+}$ and $PA_{in-}$ respectively in FIG. 3. The $n^{th}$ stage gain level, $g_{sn}$, may contribute to the overall level of gain in the PA 214, $g_3(t)$.

The overall level of gain, $g_3(t)$, for the PA 214 may be collectively based on the individual stage gains, $g_{si}$, for each of the enabled gain stages i.

Figure 4:
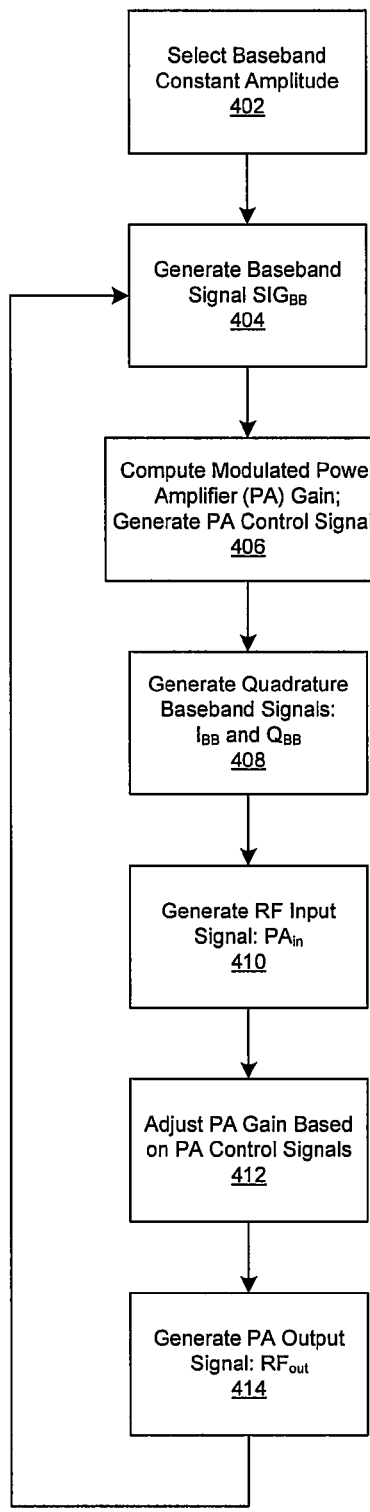
FIG. 4 is a flow chart illustrating exemplary steps for a method and system for enhancing efficiency by modulating power amplifier gain, in accordance with an embodiment of the invention.

FIG. 4 is a flow chart illustrating exemplary steps for a method and system for enhancing efficiency by modulating power amplifier gain, in accordance with an embodiment of the invention. Referring to FIG. 4, in step 402 the baseband processor 240 may select a constant amplitude, Constant, for the intermediate signal $INT_{BB}$, as shown in equation [3], which corresponds to the maximum desirable PA input level to have the maximum efficiency in the PA. In step 404, a baseband signal, $SIG_{BB}$, may be generated by the signal modulator 244. In step 406, the PA gain modulator 242 may compute the gain level, $g_1(t)$, in accordance with equation [2]. The PA gain modulator 242 may also compute a gain level, $g_3(t)$, in accordance with equations [4], [7] and [8], and generate Control Signals (FIG. 2).

In step 408, the baseband processor 240 may generate quadrature baseband signals, $I_{BB}$ and $Q_{BB}$, based on the intermediate signal $INT_{BB}$. In step 410, the PAD 212 may generate an RF input signal to the PA 214, $PA_{in}$. In step 412, the PA 214 may receive Gain Control signals (FIG. 2) based on the Control Signals (FIG. 2) that enable the PA 214 to be configured to provide a gain level, $g_3(t)$ for amplification of the $PA_{in}$ signal. In step 414, the PA 214 may generate an output signal, $RF_{out}$. Step 404 may follow step 414 as the baseband processor 240 generates a subsequent baseband signal.

In an exemplary embodiment of the invention, the value $c_2$ (equation [8]) may be 50 dB, and the value $c_1$ (equation [4]) may be 40 dB. For an exemplary baseband signal for which $\|SIG_{BB}(t)\|=0$ dB, exemplary values $g_1(t)=10$ dB, $g_2=40$ dB, and $g_3(t)=0$ dB may be utilized. In this case, $\|PA_{in}(t)\|=50$ dB and $\|RF_{out}(t)\|=50$ dB. For an exemplary baseband signal for which $\|SIG_{BB}(t)\|=10$ dB, exemplary values $g_1(t)=0$ dB, $g_2=40$ dB, and $g_3(t)=10$ dB may be utilized. In this case, $\|PA_{in}(t)\|=50$ dB and $\|RF_{out}(t)\|=60$ dB. In each exemplary case the amplitude of the input signal to the PA 214 is 50 dB. In an exemplary embodiment of the invention, the amplitude level $\|PA_{in}(t)\|=50$ dB may enable efficient operation of the PA 214 circuit. $RF_{out}$ is the amplified version of $SIG_{BB}$ with the same variation, however the input of the PA is always constant to have the maximum efficiency in the PA.

Aspects of a method and system for enhancing efficiency by modulating power amplifier (PA) gain may comprise a PA gain modulator 242 that enables modification of an amplitude of a digital baseband signal. A baseband processor 240 may enable computation of a first gain value, $g_1(t)$ based on the modification. The baseband processor 240 may enable computation of a second gain, $g_3(t)$, value based on the first gain value. A PA 214 may enable generation of an RF output signal based on the modified digital baseband signal and the second gain value. The multiplicative product of the first gain value and the second gain value may be a constant value. The amplitude of the digital baseband signal may be time varying. The amplitude of the modified digital baseband signal may be constant.

The baseband processor 240 may enable generation of quadrature baseband signals based on the modified digital baseband signal. The PAD 212 may enable generation of an input RF signal based on the generated quadrature baseband signals. At least a portion of the RF transmitter 123b chain may enable generation of the input RF signal based on the modified digital baseband signal and a third gain value, $g_2$. The third gain value may be a constant value. The PA 214 may enable generation of the RF output signal based on the generated input RF signal and the second gain value. The amplitude of the input RF signal may be constant.

In various embodiments of the invention, AM-AM distortion and/or AM-PM distortion that may result from dynamic gain adjustment may be reduced by utilizing a calibration feedback and input predistortion method as is described in U.S. patent application Ser. No. 11/618,876, which is incorporated herein by reference in its entirety.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for controlling gain in an amplifier circuit, the method comprising:
   modifying an amplitude of a digital baseband signal;
   computing a first gain value based on said modifying;
   computing a second gain value based on said first gain value; and
   generating an RF output signal based on said modified digital baseband signal and said second gain value.

2. The method according to claim 1, wherein a multiplicative product of said first gain value and said second gain value is a constant value.

3. The method according to claim 1, wherein said amplitude of said digital baseband signal is time varying.

4. The method according to claim 1, wherein an amplitude of said modified digital baseband signal is constant.

5. The method according to claim 1, comprising generating quadrature baseband signals based on said modified digital baseband signal.

6. The method according to claim 5, comprising generating an input RF signal based on said generated quadrature baseband signals.

7. The method according to claim 6, comprising generating said input RF signal based on said modified digital baseband signal and a third gain value.

8. The method according to claim 7, wherein said third gain value is a constant value.

9. The method according to claim 6, comprising generating said generated RF output signal based on said generated input RF signal and said second gain value.

10. The method according to claim 9, wherein an amplitude of said generated input RF signal is constant.

11. The method according to claim 1, comprising dynamically adjusting said first gain value based on said amplitude of said digital baseband signal.

12. The method according to claim 11, comprising dynamically adjusting said second gain value in response to said dynamically adjusted said first gain value.

13. The method according to claim 12, wherein a multiplicative product of said first gain value and said second gain value is approximately equal to a multiplicative product of said dynamically adjusted said first gain value and said dynamically adjusted said second gain value.

14. A system for controlling gain in an amplifier circuit, the system comprising:
   one or more circuits that are operable to modify an amplitude of a digital baseband signal;
   said one or more circuits are operable to compute a first gain value based on said modification;
   said one or more circuits are operable to compute a second gain value based on said first gain value; and said one or more circuits are operable to generate an RF output signal based on said modified digital baseband signal and said second gain value.

15. The system according to claim 14, wherein a multiplicative product of said first gain value and said second gain value is a constant value.

16. The system according to claim 14, wherein said amplitude of said digital baseband signal is time varying.

17. The system according to claim 14, wherein an amplitude of said modified digital baseband signal is constant.

18. The system according to claim 14, wherein said one or more circuits are operable to generate quadrature baseband signals based on said modified digital baseband signal.

19. The system according to claim 18, wherein said one or more circuits are operable to generate an input RF signal based on said generated quadrature baseband signals.

20. The system according to claim 19, wherein said one or more circuits are operable to generate said input RF signal based on said modified digital baseband signal and a third gain value.

21. The system according to claim 20, wherein said third gain value is a constant value.

22. The system according to claim 19, wherein said one or more circuits are operable to generate said generated RF output signal based on said generated input RF signal and said second gain value.

23. The system according to claim 22, wherein an amplitude of said generated input RF signal is constant.

24. The system according to claim 23, wherein said one or more circuits are operable to dynamically adjust said first gain value based on a said amplitude of said digital baseband signal.

25. The system according to claim 24, wherein said one or more circuits are operable to dynamically adjust said second gain value in response to said dynamically adjusted said first gain value.

26. The system according to claim 25, wherein a multiplicative product of said first gain value and said second gain value is approximately equal to a multiplicative product of said dynamically adjusted said first gain value and said dynamically adjusted said second gain value.

* * * * *